(12) United States Patent
Kim et al.

(10) Patent No.: US 7,478,313 B2
(45) Date of Patent: Jan. 13, 2009

(54) ENCODING APPARATUS AND METHOD, AND DECODING APPARATUS AND METHOD FOR ERROR CORRECTION

(75) Inventors: Ki-hyun Kim, Gyeonggi-do (KR); In-sik Park, Gyeonggi-do (KR); Jae-seong Shim, Seoul (KR); Sung-hyu Han, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 861 days.

(21) Appl. No.: 10/717,919

(22) Filed: Nov. 21, 2003

(65) Prior Publication Data

US 2004/0177308 A1 Sep. 9, 2004

(30) Foreign Application Priority Data

Nov. 28, 2002 (KR) ............... 10-2002-0074639

(51) Int. Cl.
*H03M 13/00* (2006.01)
*H03M 13/03* (2006.01)

(52) U.S. Cl. ............... 714/794; 714/795; 714/755
(58) Field of Classification Search ............ 714/755, 714/794, 795
See application file for complete search history.

(56) References Cited

U.S. PATENT DOCUMENTS

| | | | | |
|---|---|---|---|---|
| 6,023,783 | A * | 2/2000 | Divsalar et al. | 714/792 |
| 6,233,709 | B1 * | 5/2001 | Zhang et al. | 714/774 |
| 6,307,901 | B1 * | 10/2001 | Yu et al. | 375/341 |
| 6,445,755 | B1 * | 9/2002 | Chung et al. | 375/341 |
| 6,518,892 | B2 * | 2/2003 | Shen et al. | 341/50 |
| 6,557,139 | B2 * | 4/2003 | Bohnke | 714/758 |

(Continued)

FOREIGN PATENT DOCUMENTS

JP 2002-43953 2/2002

(Continued)

OTHER PUBLICATIONS

Hongxin Song, Richard M. Todd, and J. R. Cruz, Low Density Parity Check Codes for Magnetic Recording Channels, IEEE Transactions on Magnetics, vol. 36, No. 5, Sep. 2000.*

(Continued)

*Primary Examiner*—Joseph D Torres
(74) *Attorney, Agent, or Firm*—Stein, McEwen & Bui, LLP

(57) ABSTRACT

An encoding and decoding apparatus and method thereof includes first and second soft encoders, a transmission channel, and first and second soft decoders. The first soft encoder performs a first soft encoding of input data to correct errors in the input data and outputting first soft-encoded data. The second soft encoder receives the first soft-encoded data, performs a second soft encoding to determine a success or failure of the encoding of the first soft-encoded data, and outputs second soft-encoded data. The first soft decoder soft-decodes data input through a transmission channel and corresponds to the second soft encoding, and outputs first soft-decoded data. The second soft decoder receives the first soft-decoded data, soft-decodes the first soft-decoded data corresponding to the first soft encoding, and outputs second soft-decoded data and additional information indicating the success or failure of the decoding of the first soft-decoded data.

8 Claims, 6 Drawing Sheets

U.S. PATENT DOCUMENTS

| | | | |
|---|---|---|---|
| 6,574,775 B1 * | 6/2003 | Chouly | 714/800 |
| 6,606,724 B1 * | 8/2003 | Krieger et al. | 714/755 |
| 6,757,122 B1 * | 6/2004 | Kuznetsov et al. | 360/53 |
| 6,757,865 B1 * | 6/2004 | Nakamura et al. | 714/796 |
| 6,965,652 B1 * | 11/2005 | Burd et al. | 375/341 |
| 2002/0016944 A1 | 2/2002 | Yoshida et al. | |

FOREIGN PATENT DOCUMENTS

| | | |
|---|---|---|
| JP | 2002-135134 | 5/2002 |
| JP | 2002-171174 | 6/2002 |

OTHER PUBLICATIONS

Jing Li, Krishna R. Narayanan, Erozan Kurtas, and Costas N. Georghiades, On the Performance of High-Rate TPC/SPC Codes and LDPC Codes Over Partial Response Channels, IEEE Transactions on Communications, vol. 50, No. 5, May 2002.*

Office Action issued in Japanese Patent Application No. 2003-397175 on Sep. 6, 2005.

* cited by examiner

ENCODING APPARATUS AND METHOD, AND DECODING APPARATUS AND METHOD FOR ERROR CORRECTION

CROSS-REFERENCE TO RELATED APPLICATIONS

This application claims the priority of Korean Patent Application No. 2002-74639, filed on Nov. 28, 2002, in the Korean Intellectual Property Office, the disclosure of which is incorporated herein in its entirety by reference.

BACKGROUND OF THE INVENTION

1. Field of the Invention

The present invention relates to encoding and decoding fields, and more particularly to an encoding apparatus and method, and a decoding apparatus and method, for performing signal detection and/or error correction by interconnecting only soft-type encoding apparatuses.

2. Description of the Related Art

Generally, signals transmitted through various transmission channels, for example, a spatial medium for digital television broadcasting or a recording medium, such a CD, a DVD, etc., have certain signal distortion. In order to restore the distorted signals, various signal detection and error correction techniques have been developed.

Conventional data detection and error correction techniques include hard encoding/decoding methods such as a Reed Solomon code, a BCH code, etc., and soft encoding/decoding methods such as a Turbo code, Low Density Parity Check (LDPC) code, etc.

A decoder that implements the hard decoding methods receives a data word including a hard value of "1" or "−1" from a demodulator, and outputs an error-corrected data word. Further, the decoder that implements the soft decoding methods receives a soft value representing probability of the data word from the demodulator, and outputs the error-corrected data word. That is, the input of the soft decoder is not a hard value of "1" or "−1" but a soft value such as "0.8", "−0.8", etc., where the soft value itself includes probability of a data word value being "1" or "−1".

Meanwhile, both the decoder implementing the hard encoding methods and the decoder implementing the soft encoding methods have a function of adding parity information to transmission data, in order to perform the operations described above.

Such conventional techniques, which perform the data detection and the error correction using hard coding and soft coding, include a method which uses only either the hard coding or the soft coding, a method which performs successive encoding/decoding by using the hard coding and the soft coding together, a method which decodes by repeating the hard coding, and a method which uses the hard coding and the soft coding together but merely adds a hard-type output as additional information to a soft-type output, etc.

However, all of the above conventional techniques have difficulties in obtaining a satisfying performance in detection and error correction performance. Specially, the conventional techniques, which merely connect the hard coding and the soft coding has a problem in that information loss occurs in a process of converting the output information of the soft-type decoder into the information suitable for the hard-type decoder, and complexity increases significantly in a case of decoding the output information into the soft-type data.

SUMMARY OF THE INVENTION

The present invention provides a encoding apparatus and method to improve detection and error correction performance upon data decoding by interconnecting soft-type decoders.

The present invention also provides an encoding apparatus and method to improve detection and error correction performance upon data decoding by again soft encoding after interleaving soft-encoded data.

The present invention also provides a decoding apparatus and method to improve detection and error correction performance by interconnecting soft-type decoders to restore signals passed through various channels or signals distorted by other sources.

The present invention also provides a decoding apparatus and method that soft-decodes data transmitted through various channels by soft encoding after interleaving soft-encoded data.

The present invention also provides an encoding and decoding apparatus and method to improve a detection and error correction performance upon data decoding by interconnecting soft-type encoders.

Additional aspects and/or advantages of the invention will be set forth in part in the description which follows and, in part, will be obvious from the description, or may be learned by practice of the invention.

According to an aspect of the present invention, there is provided an encoding apparatus including: a first soft encoder performing a first soft encoding intended for use in a decoding device to correct errors to recover originally first encoded input data and outputting first soft-encoded data; and a second soft encoder receiving the first soft-encoded data, performing a second soft encoding intended for use in a decoding device to determine a success or failure during decoding of the first soft-encoded data, and outputting second soft-encoded data.

It is preferable that the first soft encoder uses a turbo encoding method, and the second soft encoder uses a Low Density Parity Check (LDPC) coding method.

The encoding apparatus further includes an interleaver interleaving the first soft-encoded data in a predetermined interleaving order. The interleaver interleaves the first encoded data with code block units and generates interleaved code blocks having a same number of code blocks as the code blocks of the second soft encoder. Also, the interleaver interleaves an area from a middle of a code block of the first soft encoder to the middle of a next code block thereof as an interleaving unit when the first and the second soft encoders have a same value in corresponding code block unit sizes, and generates the interleaved data, wherein two code blocks of the first soft encoder have influence on a creation of one code block of the second soft decoder.

According to another aspect of the present invention, there is provided a decoding apparatus including: a first soft decoder performing a first soft decoding of input data to correct errors in the input data and outputting first soft-decoded data; and a second soft decoder receiving the first soft-decoded data, performing a second soft decoding of the first soft-decoded data, and outputting second soft-decoded data and additional information indicating a success or failure of the decoding of the first soft-decoded data.

The first soft decoder may repeatedly decode second soft-decoded data fed back in response to the additional information indicating the failure of decoding.

The decoding apparatus further includes: a de-interleaver de-interleaving the first soft-decoded data corresponding to an interleaving order used upon encoding; and an interleaver which, according to the additional information, performs a hard-decision for successfully decoded data to restore original data, puts a soft output of the second soft decoder in a space of non-decoded data, performs interleaving, and feeds back the interleaved data to the first soft decoder, wherein the first soft decoder performs repeated decoding.

Also, the decoding apparatus further includes: a de-interleaver de-interleaving the first soft-decoded data corresponding to an interleaving order used upon encoding; an interleaver which, according to the additional information, performs a hard-decision for successfully decoded data of the second soft-decoded data to restore original data, keeps a space of non-decoded data of the second soft-decoded data empty, performs interleaving, and outputs the interleaved data; and a data insertion unit inserting an output of the first soft decoder in the empty space of the interleaved data output from the interleaver and feeding back resulting data indicative thereof to the first soft decoder, wherein the first soft decoder performs repeated decoding.

According to still another aspect of the present invention, there is provided an encoding and decoding apparatus including: a first soft encoder performing a first soft encoding intended for use in a decoding device of input data to correct errors to recover originally first encoded input data and outputting first soft-encoded data; a second soft encoder receiving the first soft-encoded data, performing a second soft encoding intended for use in a decoding device to determine a success or failure during decoding of the first soft-encoded data, and outputting second soft-encoded data; a transmission channel; a first soft decoder soft-decoding data input through the transmission channel and corresponding to the second soft encoding, and outputting first soft-decoded data; and a second soft decoder receiving the first soft-decoded data, soft-decoding the first soft-decoded data corresponding to the first soft encoding, and outputting second soft-decoded data and additional information indicating the success or failure of the decoding of the first soft-decoded data.

According to still another aspect of the present invention, there is provided an encoding method including: performing a first soft encoding intended for use in a decoding device of input data to correct errors to recover originally first encoded input data and outputting first soft-encoded data; receiving the first soft-encoded data; performing a second soft encoding intended for use in a decoding device to determine a success or failure during decoding of the first soft-encoded data; and outputting second soft-decoded data.

According to still another aspect of the present invention, there is provided a decoding method including: performing a first soft decoding of input data to correct errors in the input data and outputting first soft-decoded data; receiving the first soft-decoded data; performing a second soft decoding of the first soft-decoded data; and outputting second soft-decoded data and additional information indicating a success or failure of the decoding of the first soft-decoded data.

According to still another aspect of the present invention, there is provided an encoding and decoding method including: performing a first soft encoding intended for use in a decoding device of input data to correct errors to recover originally first encoded input data and outputting first soft-encoded data; performing a second soft encoding intended for use in a decoding device to determine a success or failure during decoding of the first soft-encoded data; soft-decoding data input through a transmission channel, wherein the soft-decoding corresponds to the second soft-encoding; soft-decoding the first soft-decoded data corresponding to the first soft-encoding; and outputting second soft-decoded data and additional information indicating the success or failure of the decoding of the first soft-decoded data.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
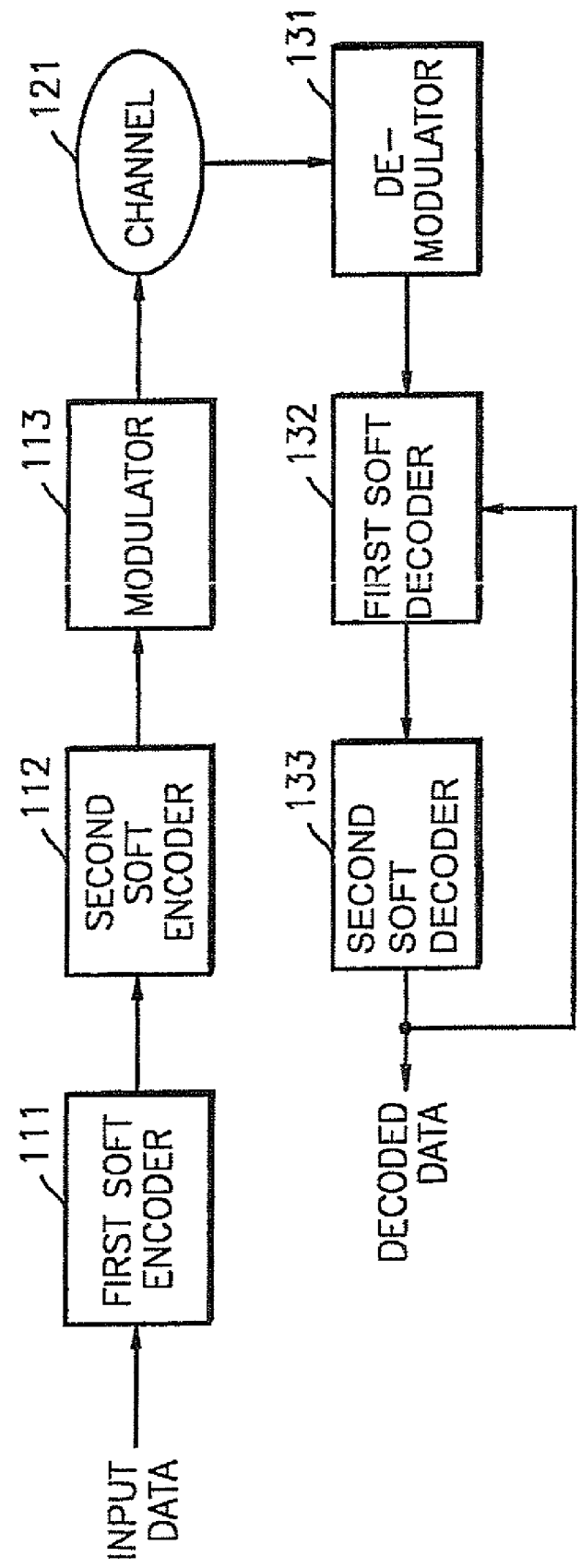
FIG. 1 is a block diagram of a system using encoding and decoding apparatuses for error correction, according to an aspect of the present invention.

Reference will now be made in detail to the aspects of the present invention, examples of which are illustrated in the accompanying drawings, wherein like reference numerals refer to the like elements throughout. The aspects are described below to explain the present invention by referring to the figures.

FIG. 1 is a block diagram of a system using encoding and decoding apparatuses for error correction, according to an aspect of the present invention, wherein the system includes an encoding unit for error correction. The encoding unit includes a first soft encoder 111, a second soft encoder 112, a modulator 113, a channel 121, a demodulator 131. The system also includes a decoding unit for error correction, which includes a first soft decoder 132 and a second soft decoder 133.

Referring to FIG. 1, the first soft encoder 111 soft-encodes input data according to a predetermined soft encoding method, for example, a Low Density Parity Check (LDPC) coding method capable of determining a success or a failure of decoding. The predetermined soft encoding method corrects errors in input data. The second soft encoder 112 also soft-encodes the soft-encoded data according to the predetermined soft encoding method, for example, a turbo encoding method, in order to correct the error in the soft-encoded data output from the first soft encoder 111.

The modulator 113 modulates the data encoded by the encoding unit using a modulation method, such as a Run-Length Limit (RLL) code. The resultant modulated data is distorted via various transmission channels 121, such as a recoding medium, and is input in the form of a distorted signal to the demodulator 131. The demodulator 131 demodulates the input data, according to a demodulation method corresponding to the modulation method used by the modulator 113, and outputs the demodulated data to the first soft decoder 132.

The first soft decoder 132 receives the demodulated data and soft-decodes the demodulated data according to the predetermined soft decoding method for the error correction. For example, the first soft decoder 132 turbo-decodes the demodulated data corresponding to the soft encoding method used in the encoding process for the error correction, i.e., the turbo encoding method. Instead of the turbo decoding, an iterative decoding method may be used, which outputs soft output values. The second soft decoder 133 receives the data decoded by the first soft decoder 132 and soft-decodes the data according to the predetermined soft decoding method for the error correction. The second soft decoder 133 LDPC-decodes the data corresponding to the soft encoding method used in the encoding process for the error correction, i.e., the LDPC encoding method. Here, the LDPC decoding can determine the success or failure of data decoding.

The second soft decoder 133 feeds back additional information to the first soft decoder 132. The additional information indicates whether the soft-decoded data and the decoded data are successfully decoded, thereby performing iterative decoding. This process will now be described in more detail with reference to FIGS. 2 and 3.

Figure 2:
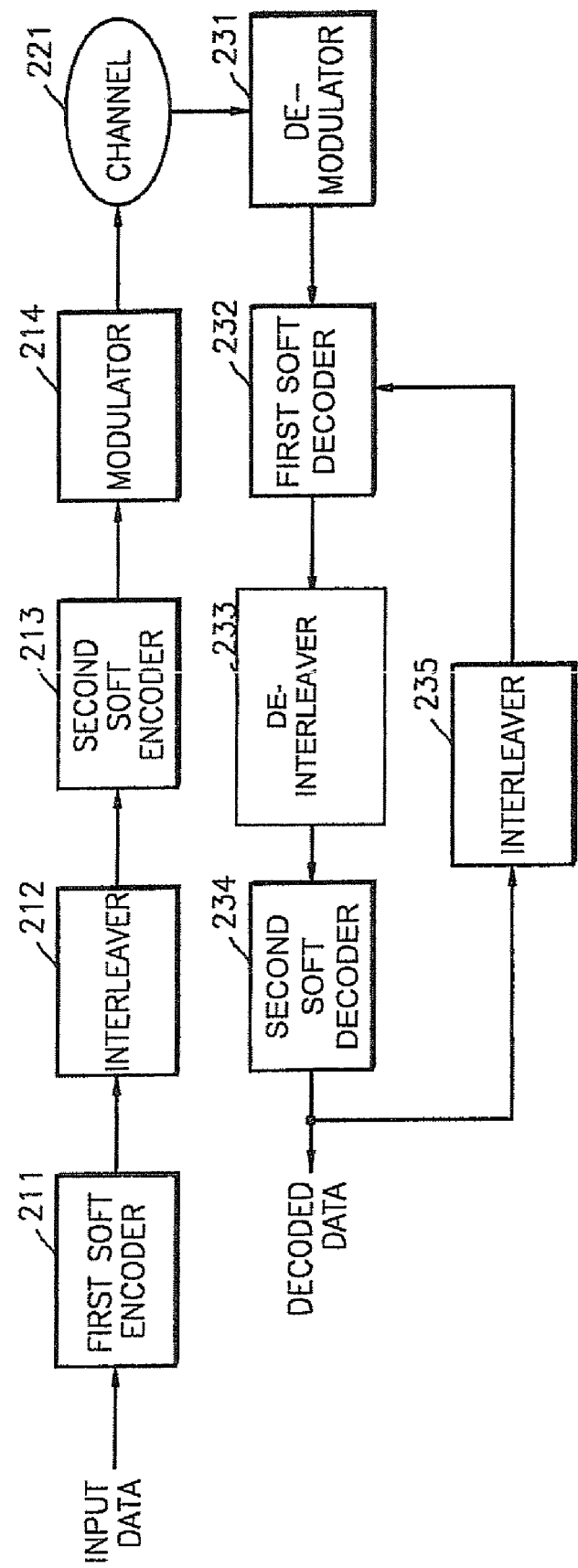
FIG. 2 is a block diagram of another system using the encoding and the decoding apparatuses for error correction, according to an aspect of the present invention.

FIG. 2 is a block diagram of another system using encoding and decoding apparatuses for error correction, according to an aspect of the present invention. The system includes a first soft encoder 211, the encoding unit for the error correction, and the decoding unit for the user correction. The encoding unit for the error correction includes an interleaver 212 and a second soft encoder 213, a modulator 214, a channel 221, and a demodulator 231. The decoding unit for the error correction includes a first soft decoder 232, a de-interleaver 233, a second soft decoder 234 and an interleaver 235. Here, the first and the second soft decoders 211 and 213 are the same devices as the first and the second soft decoders 132 and 133 of FIG. 1, respectively, and accordingly operate in the same manner as those of FIG. 1. The interleaver 212 and the decoding unit are described below.

Figure 4:
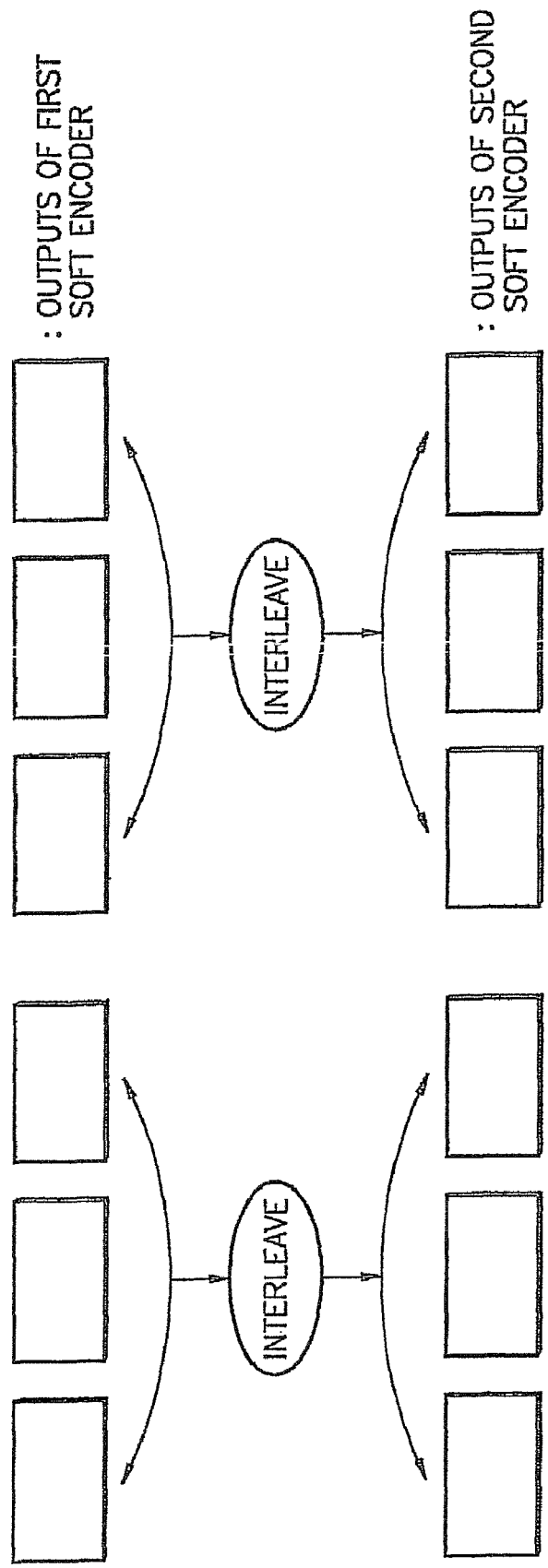
FIG. 4 shows an example of an interleaving order, according to an aspect of the present invention.

Referring to FIG. 2, the interleaver 212 interleaves soft-encoded data output from the first soft encoder 211. The interleaver 212 binds and interleaves several code blocks passed through the first soft encoder 211, at one time, and generates and outputs interleaved code blocks having a same number as the code blocks of the second soft encoder 213, as shown in FIG. 4.

As another example of the interleaver 212, in a case where the two soft encoders 211 and 213 and the two soft decoders 232 and 234 have the same value in corresponding code block unit sizes and it is difficult to bind and interleave several code blocks because one code block length is very long, an area from a middle of one code block of the first soft encoder 211 to the middle of the next code block thereof is interleaved as a start location of a code block of the second soft encoder 213. Accordingly, interleaved code blocks are generated and provided to the second soft encoder 213. Here, two code blocks of the first soft encoder 211 have influence on creation of one code block to be subjected to the second soft encoding.

Also, the first soft decoder 232 of the decoding unit for error correction receives the decoded data, turbo-decodes the demodulated data, and generates a soft output value. The de-interleaver 233 receives the soft output value as a decoding block unit and de-interleaves the soft output value to restore the original sequence thereof before being interleaved. The second soft decoder 234 receives and LDPC-decodes the de-interleaved data, and outputs the decoded data and a signal indicating the success or the failure of the decoding. The interleaver 235 performs a hard-decision for a successfully decoded signal to restore the original signal (1/−1) in response to the signal indicating successful decoding. Further, in response to the signal indicating failed decoding, the interleaver 235 puts the output of the second soft decoder 234 itself in the location of a non-decoded past of the signal, performs interleaving in a reverse order of de-interleaving performed by the de-interleaver 233, outputs the interleaved result to the first soft decoder 232, and performs repeated decoding. Therefore, it is possible to improve the signal detection and the error correction performance.

Figure 3:
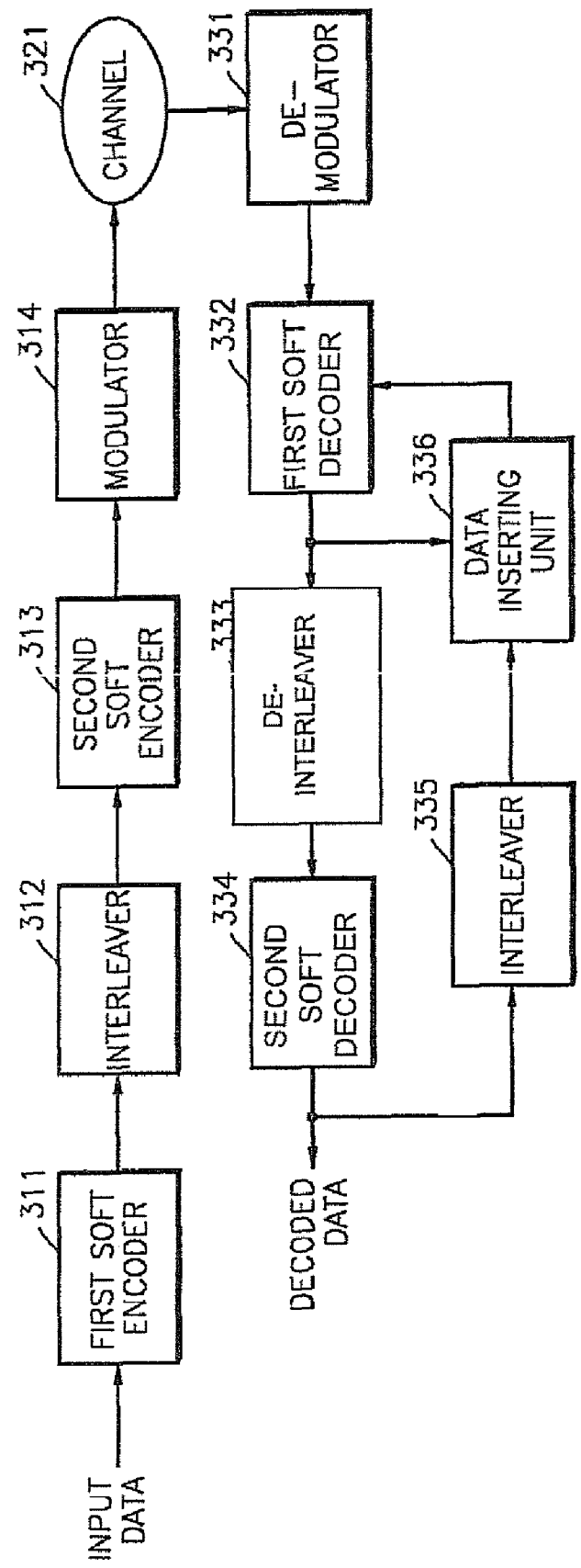
FIG. 3 is a block diagram of still another system using the encoding and the decoding apparatuses for error correction, according to an aspect of the present invention.

FIG. 3 is a block diagram of still another system using the encoding and decoding apparatuses for the error correction, according to an aspect of the present invention. The system includes a first soft encoder 311, the encoding unit for the error correction, and the decoding unit for the user correction. The encoding unit for the error correction includes an interleaver 312 and a second soft encoder 313, a modulator 314, a channel 321, and a demodulator 331. The decoding unit for the error correction includes a first soft decoder 332, a de-interleaver 333, a second soft decoder 334, an interleaver 335 and a data insertion unit 336. Here, the first and second soft encoders 311 and 313, the interleaver 312, the demodulator 314, the channel 321, and the demodulator 331 are the same as their counter parts in FIG. 2, and operate in the same manner as described with reference to FIG. 2. The decoding unit for the error correction is described below.

Referring to FIG. 3, the first soft decoder 332 receives and turbo-decodes the decoded data and generates the soft output value. The de-interleaver 333 receives the soft output value as the code block unit and de-interleaves the soft output value to restore the original sequence thereof before being interleaved. The second soft decoder 334 receives and LDPC-decodes the de-interleaved data and outputs the decoded data and the signal indicating the success or failure of the decoding. The interleaver 335 performs the hard-decision for a successfully decoded signal in response to the signal indicating successful decoding to restore the original signal (1/−1), performs interleaving in a reverse order of the de-interleaving performed by the de-interleaver 333, and arranges the resulting data in the same sequence as output data of the first soft decoder 332. When interleaving is performed, a space for the non-decoded data is kept empty.

The data insertion unit 336 receives the interleaved data from the interleaver 335 according to the sequence of the output data of the interleaver 335 and the sequence of the output data of the first soft decoder 332. The data insulation unit 336 inserts the output data from the first soft decoder 332 in an empty space of the output data of the interleaver 335, and, then, outputs resultant data to the first soft decoder 332. The first soft decoder 332 soft-decodes the received data again.

Figure 5:
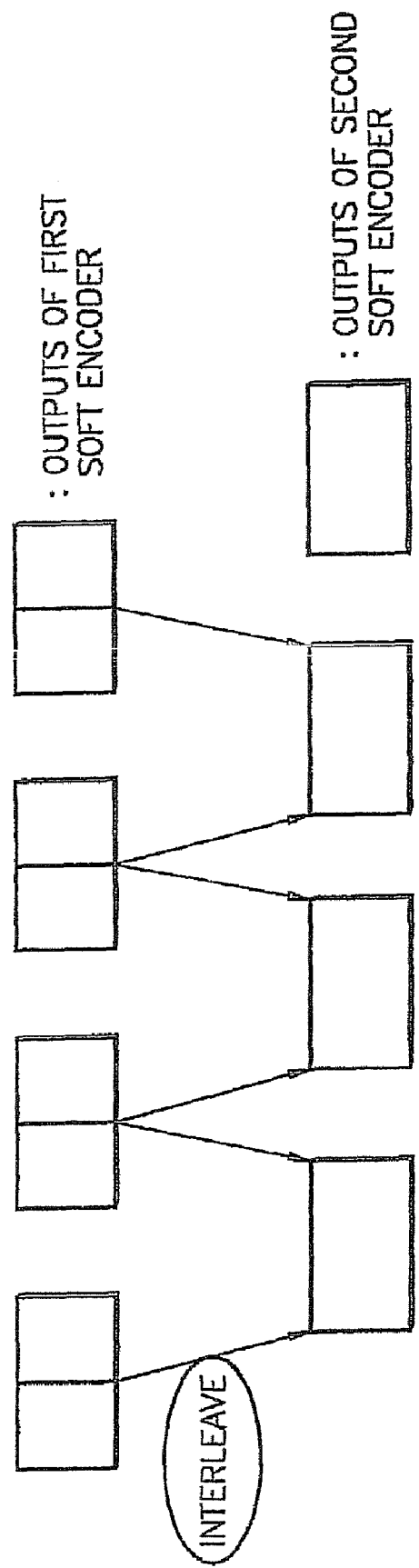
FIG. 5 shows another example of the interleaving order, according to an aspect of the present invention.

Accordingly, the error correction performance is improved by repeatedly decoding for correcting errors in the error-corrected data. Also, by interleaving two code blocks for the first soft encoding and creating one code block for the second soft encoding, according to the interleaving order shown in FIG. 5, in the interleaving process of the data encoding apparatus, the data in the two code blocks subjected to the first soft decoding is distributed and arranged appropriately to one code block, which is subjected to the second soft decoding to improve error correction performance. Also, an interleaving unit is implemented as one code block, which facilitates interleaving. Here, the operation count of such repeated decoding can be determined by the designer of the decoding apparatus.

Figure 6:
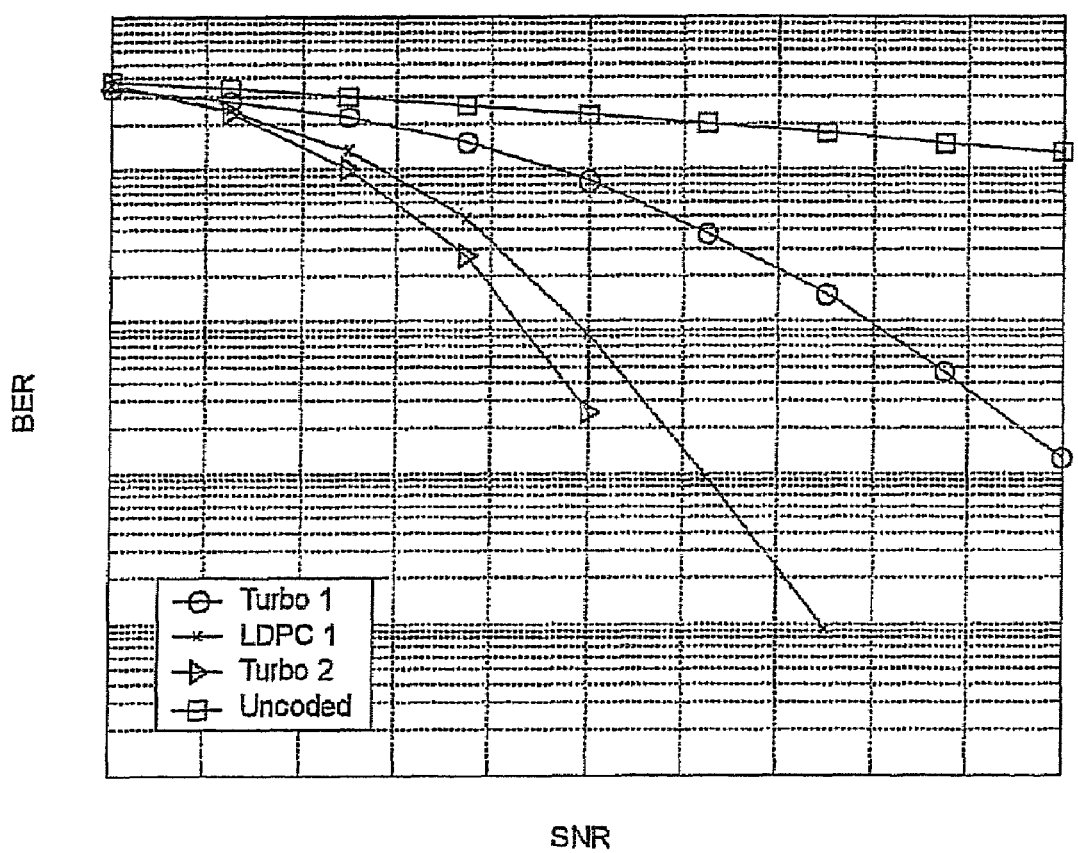
FIG. 6 is a graph showing decoding performance of the decoding apparatus for error correction, according to an aspect of the present invention.

FIG. 6 is a graph showing decoding performance of the decoding apparatus for the error correction, according to an aspect of the present invention. A plot denoted by "□" represents the error rate of the data before being soft-decoded, the plot denoted by "○" represents the error rate of the output data after the turbo type soft decoding is performed, the plot denoted by "X" represents the error rate of the output data after the data soft-decoded by the turbo decoding method is soft-decoded using the LDPC decoding method, and the plot denoted by "Δ" represents the error rate of the output data after the data soft-decoded by the LDPC decoding method is again decoded using the turbo decoding method. As illustrated in FIG. 6, it is seen that as the decoding operations are repeated, the error rate is reduced.

The present invention may be embodied as a program stored on a computer readable medium that can be run on a general computer. Here, the computer readable medium includes but is not limited to storage media such as magnetic storage media (e.g., ROM's, floppy disks, hard disks, etc.) and optically readable media (e.g., CD-ROMs, DVDs, etc.). The present invention may also be embodied as a computer readable program code unit stored on a computer readable medium, for causing a number of computer systems connected via a network to affect distributed processing.

As described above, according to an aspect of the present invention, it is possible to improve signal detection and error correction performance without information loss, by encoding data using interconnection of soft coding methods and repeatedly decoding the encoded data.

Although a few aspects of the present invention have been shown and described, it would be appreciated by those skilled in the art that changes may be made in this aspect without departing from the principles and spirit of the invention, the scope of which is defined in the claims and their equivalents.

What is claimed is:

1. A decoding apparatus, comprising:
   a first soft decoder performing a first soft decoding of input data to correct errors in the input data and outputting first soft-decoded data;
   a de-interleaver de-interleaving the first soft-decoded data corresponding to an interleaving order used upon encoding;
   a second soft decoder receiving the first soft-decoded data, performing a second soft decoding of the first soft-decoded data, and outputting second soft-decoded data and additional information indicating a success or failure of the decoding of the first soft-decoded data; a hard-decision unit performing, according to the additional information, a hard-decision for successfully decoded data of the second soft-decoded data to restore original data;
   a reserving unit reserving a portion of non-decoded data of the second soft-decoded data for the first soft-decoded data to be inserted into:
   an interleaver performing interleaving of the data, and outputting the interleaved data; and
   a data insertion unit inserting an output of the first soft-decoder in the portion of the interleaved data output from the interleaver and feeding back resulting data indicative thereof to the first soft decoder,
   wherein the first soft-decoder performs repeated decoding.

2. The decoding apparatus of claim 1, wherein the first soft decoder uses a turbo decoding method.

3. The decoding apparatus of claim 1, wherein the second soft decoder uses a Low Density Parity Check (LDPC) decoding method.

4. The decoding apparatus of claim 1, wherein the first soft decoder repeatedly decodes the second soft-decoded data fed back in response to the additional information indicating the failure of the decoding.

5. A decoding method, comprising:
   performing a first soft decoding of input data to correct errors in the input data and outputting first soft-decoded data;
   de-interleaving the first soft-decoded data corresponding to an interleaving order used upon encoding;
   performing a second soft decoding of the first soft-decoded data;
   outputting the second soft-decoded data and additional information indicating a success or failure of the decoding of the first soft-decoded data; and
   according to the additional information performing a hard-decision to successfully decode the data of the second soft-decoded data to restore original data, reserving a portion of non-decoded data of the second soft decoded data for the first soft-decoded data to be inserted into, interleaving the data, and outputting the interleaved data;
   inserting the first soft-decoded data in the portion of the interleaved data; and
   performing the first soft decoding of the resulting data, wherein the first soft-decoding is performed repeatedly.

6. The decoding method of claim 5, further comprising:
   implementing the first soft decoding using a turbo decoding method.

7. The decoding method of claim 5, further comprising:
   implementing the second soft decoding is using a Low Density Parity Check (LDPC) decoding method.

8. The decoding method of claim 5, wherein the first soft-decoding further comprises:
   performing repeated decoding of the second soft-decoded data fed back in response to the additional information indicating the failure of the decoding.

* * * * *